US011159105B2

(12) United States Patent
Cappelleri et al.

(10) Patent No.: US 11,159,105 B2
(45) Date of Patent: Oct. 26, 2021

(54) LIGHT RESPONSIVE POLYMER MAGNETIC MICROROBOTS

(71) Applicant: Purdue Research Foundation, West Lafayette, IN (US)

(72) Inventors: David J. Cappelleri, West Lafayette, IN (US); Maria Guix Noguera, Barcelona (ES); Song Zhang, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 738 days.

(21) Appl. No.: 16/034,401

(22) Filed: Jul. 13, 2018

(65) Prior Publication Data

US 2019/0020291 A1 Jan. 17, 2019

Related U.S. Application Data

(60) Provisional application No. 62/532,543, filed on Jul. 14, 2017.

(51) Int. Cl.
| | |
|---|---|
| *H02N 10/00* | (2006.01) |
| *B81B 3/00* | (2006.01) |
| *B25J 7/00* | (2006.01) |
| *B25J 9/00* | (2006.01) |
| *F03G 7/06* | (2006.01) |

(52) U.S. Cl.
CPC ............... *H02N 10/00* (2013.01); *B25J 7/00* (2013.01); *B25J 9/0009* (2013.01); *B81B 3/0024* (2013.01); *B81B 3/0029* (2013.01); *F03G 7/06* (2013.01); *B81B 2201/031* (2013.01)

(58) Field of Classification Search
CPC .... H02N 10/00; B81B 3/0029; B81B 3/0024; B81B 2201/031; B25J 7/00; B25J 9/0009; F03G 7/06
USPC .............................. 60/527–529; 310/306–309
See application file for complete search history.

(56) References Cited

U.S. PATENT DOCUMENTS

| | | | |
|---|---|---|---|
| 7,071,594 B1 * | 7/2006 | Yan ....................... | G02B 26/085 310/309 |
| 8,405,256 B2 * | 3/2013 | Vollmers ................. | H02K 33/00 310/15 |
| 2007/0220882 A1 * | 9/2007 | Culpepper ............ | B81B 3/0062 60/527 |
| 2017/0254978 A1 * | 9/2017 | Chong ..................... | G02B 7/09 |

OTHER PUBLICATIONS

Huang et al., "Magnetic microrobots with addressable shape control", In 2016 IEEE International Conference on Robotics and Automation (ICRA), 2016, pp. 1719-1724.
(Continued)

*Primary Examiner* — Hoang M Nguyen
(74) *Attorney, Agent, or Firm* — Piroozi-IP, LLC

(57) ABSTRACT

A microrobot is disclosed. The microrobot includes a magnet configured to provide a motive force when magnetic force of one or more electrical coils act upon the magnet, a support member coupled to the magnet, a thermo-responsive polymer member coupled to each end of the support member at a proximal end, the thermo-responsive polymer member configured to articulate when heated, wherein the thermo-responsive polymer members configured to receive light from a microrobot structured light system and convert the received light into heat.

20 Claims, 8 Drawing Sheets

(56) References Cited

OTHER PUBLICATIONS

Stuart et al., "Emerging applications of stimuli-responsive polymer materials", Nature Materials, 9(2), Feb. 2010, pp. 101-113.
Breger et al., "Self-Folding Thermo-Magnetically Responsive Soft Microgrippers", ACS Applied Materials & Interfaces, 7(5), Feb. 2015, pp. 3398-3405.
Kuo et al., "Gold nanorods in photodynamic therapy, as hyperthermia agents, and in near-infrared optical imaging", Angewandte Chemie—International Edition, 49(15), 2010, pp. 2711-2715.
Abidin et al., "Recent advances in electrochromic polymers", Polymer, 55(21), Oct. 2014, pp. 5293-5304.
Jensen et al., "Direct Photopatterning of Electrochromic Polymers", Advanced Functional Materials, 23(30), Aug. 2013, pp. 3728-3737.
Chowdhury et al., "Controlling multiple microrobots: recent progress and future challenges", Journal of Micro-Bio Robotics, 10(1), 2015, pp. 1-11.
Cappelleri et al., "A two dimensional vision-based force sensor for microrobotic applications", Sensors and Actuators A: Physical, 171(2), 2011, pp. 340-351.
Jing et al., "Incorporating in-situ force sensing capabilities in a magnetic microrobot", In Intelligent Robots and Systems (IROS 2014), 2014 IEEE/RSJ International Conference on, pp. 4704-4709.
Cappelleri et al., 2009, "Two-dimensional, vision-based micro-newton force sensor for microrobotics", In Robotics and Automation, 2009. ICRA '09. IEEE International Conference on, 2014, pp. 1016-1021.
Chowdhury et al., "Towards independent control of multiple magnetic mobile microrobots", Micromachines, 7 (1), 2016, p. 3.
Chowdhury et al., "Path planning for autonomous navigation of magnetic mobile microrobots", In ASME International Design Engineering Technical Conference (IDETC), 2015.
Cappelleri et al., "Towards mobile microrobot swarms for additive micromanufacturing", International Journal of Advanced Robotic Systems, 11(150). DOI: 10.5772/58985, 2014.
Zhang et al., "High-accuracy, High-speed 3D Structured Light Imaging Techniques and Potential Applications to ntelligent Robotics", International Journal of Intelligent Robotics and Applications (JIRA), pp. 1-18, Jan. 2017.
Jing et al., "A magnetic microrobot with in situ force sensing capabilities", Robotics 3(2), 2014, pp. 106-119.
Chowdhury et al., "Independent Actuation of Multiple Microrobots using Localized Magnetic Fields", IFFE International Conference on Robotics, Manipulation, and Automation at Small Scales (MARSS), Paris, France, Jul. 18-22, 2016.
Chowdhury et al., "Designing Local Magnetic Fields and Path Planning for Independent Actuation of Multiple Mobile Microrobots", Journal of Micro-Bio Robotics (JMBR), vol. 12, Issue 1, Jun. 2017, pp. 21-31.
Ekstrand et al., "High-resolution, high-speed three-dimensional video imaging with digital fringe projection techniques", Journal of Visualized Experiments, 2013.
Bell et al., "Towards superfast three-dimensional optical metrology with digital micromirrrordevice (DMD) platforms", Opt. Eng., 53(11), 2014, p. 112206.
Zhang, S., "Recent progresses on real-time 3-d shape measurement using digital fringe projection techniques", Opt. Laser Eng., 48(2), 2010, pp. 149-158.
Hyun et al., "High-speed high-accuracy three-dimensional shape measurement using digital binary defocusing method versus sinusoidal method," Opt. Eng. 56(7), Jul. 2017.
Li et al., "Microscopic structured light 3d profilometry: binary defocusing technique vs sinusoidal fringe projection", Opt. Laser Eng., 2016.
Enachi et al., "Light-Induced Motion of Microengines Based on Microarrays of TiO 2 Nanotubes", Small, 12 (39), Oct. 2016, pp. 5497-5505.
Magdanz et al., "Dynamic Polymeric Microtubes for the Remote-Controlled Capture, Guidance, and Release of Sperm Cells", Advanced Materials, 28(21), 2016, pp. 4084-4089.
Palagi et al., "Structured light enables biomimetic swimming and versatile locomotion of photoresponsive soft microrobots", Nature Materials, 15(6), 2016, pp. 647-653.

* cited by examiner

LIGHT RESPONSIVE POLYMER MAGNETIC MICROROBOTS

CROSS-REFERENCE TO RELATED APPLICATIONS

The present patent application is related to and claims the priority benefit of U.S. Provisional Application Ser. No. 62/532,543 filed Jul. 14, 2017, the contents of which is hereby incorporated by reference in its entirety into the present disclosure.

STATEMENT REGARDING GOVERNMENT FUNDING

This invention was made with government support under NSF IIS 1433967, IIS 1358446, and CMMI-1150711 awarded by the National Science Foundation. The government has certain rights in the invention.

TECHNICAL FIELD

The present disclosure generally relates to untethered microrobots and particularly to an actuation method and system, and methods of sensing.

BACKGROUND

This section introduces aspects that may help facilitate a better understanding of the disclosure. Accordingly, these statements are to be read in this light and are not to be understood as admissions about what is or is not prior art.

Microrobots are known. A challenge of developing systems using untethered microrobots is how to power these devices. In most applications an onboard power supply is not an option. Thus generally microrobot systems have to overcome the size restrictions that do not allow for on-board actuation, sensing, power, and control; and due to the unique interaction forces, the conventional actuation principles utilizing the gravitational forces typically do not work. These challenges mean that most artificial mobile microrobots today have no on-board actuators or sensors.

For these systems, energy harvesting using magnetic fields for propulsion is an attractive option. Such systems are known. An example is provided in U.S. Pat. No. 8,405,256 to Vollmers et al. In most cases microrobots are rigid monolithic structures, directly manipulated by torques or forces applied by external magnetic, electric, or optical fields globally applied over the entire workspace or manipulated by chemical reactions.

Some recent designs consist of flexible materials that allow a small number of non-actuated or passive degrees of freedom of the robot body or end-effector. Soft active materials have produced microrobots with additional functionalities, such as on-demand drug release. Despite their soft active bodies, however, these microrobots each have a singular function and few degrees of freedom.

In certain applications such as manipulation of cells, it is necessary to design end-effectors that can grab and manipulate micro-sized objects. In addition, there is a need to measure micro-forces applied to and measure various characteristics (see, e.g., below) of the objects being manipulated such that little to no energy is used by the microrobots. In the biological research domain, researchers have long been interested in studying the electrical properties of cells and in particular cancer cells. Cells of the body possess electrical mechanisms and use electricity to regulate and control the transduction of chemical energy and other biological processes. Cancer cells, in particular, possess different electrical and chemical properties than normal cells. There is thus a need for an in situ tool adapted to probe and sense the electrical potentials and connections of cells which advantageously allow for characterization and the study of therapeutic strategies to assist in the treatment of various cancers. Such a toolset does not exist in the prior art.

Therefore, there is an unmet need to realize advantages of using an untethered microrobot by developing novel and advanced end-effector actuation designs and on-board sensing capabilities.

SUMMARY

A microrobot system is disclosed. The microrobot system includes a microrobot structured light system, comprising a structured light source adaptable to selectively shine structured light. The system also includes a microrobot vision system adaptable to ascertain position and color of an object. The system further includes a microrobot articulation system, which includes a substrate, one or more electrical coils each adaptable to provide a magnetic force in an XYZ coordinate system, and one or more microrobots disposed on the substrate. Each microrobot includes a magnet which is configured to provide a motive force when magnetic force of the one or more electrical coils act upon the magnet, a support member coupled to the magnet, a thermo-responsive polymer member coupled to each end of the support member at a proximal end, the thermo-responsive polymer member configured to articulate when heated, wherein the thermo-responsive polymer members configured to receive light from the microrobot structured light system and convert the received light into heat.

The microrobot system disclosed further includes an electrochromic polymer member coupled to a distal end of the thermo-responsive polymer member, the electrochromic polymer members configured to change colors when coupled across an object having an electrical potential.

A microrobot is disclosed. The microrobot includes a magnet which is configured to provide a motive force when magnetic force of one or more electrical coils act upon the magnet, a support member coupled to the magnet, a thermo-responsive polymer member coupled to each end of the support member at a proximal end, the thermo-responsive polymer member configured to articulate when heated, wherein the thermo-responsive polymer members configured to receive light from a microrobot structured light system and convert the received light into heat.

The microrobot disclosed further includes an electrochromic polymer member coupled to a distal end of the thermo-responsive polymer member, the electrochromic polymer members configured to change colors when coupled across an object having an electrical potential.

DETAILED DESCRIPTION

Figure 1:
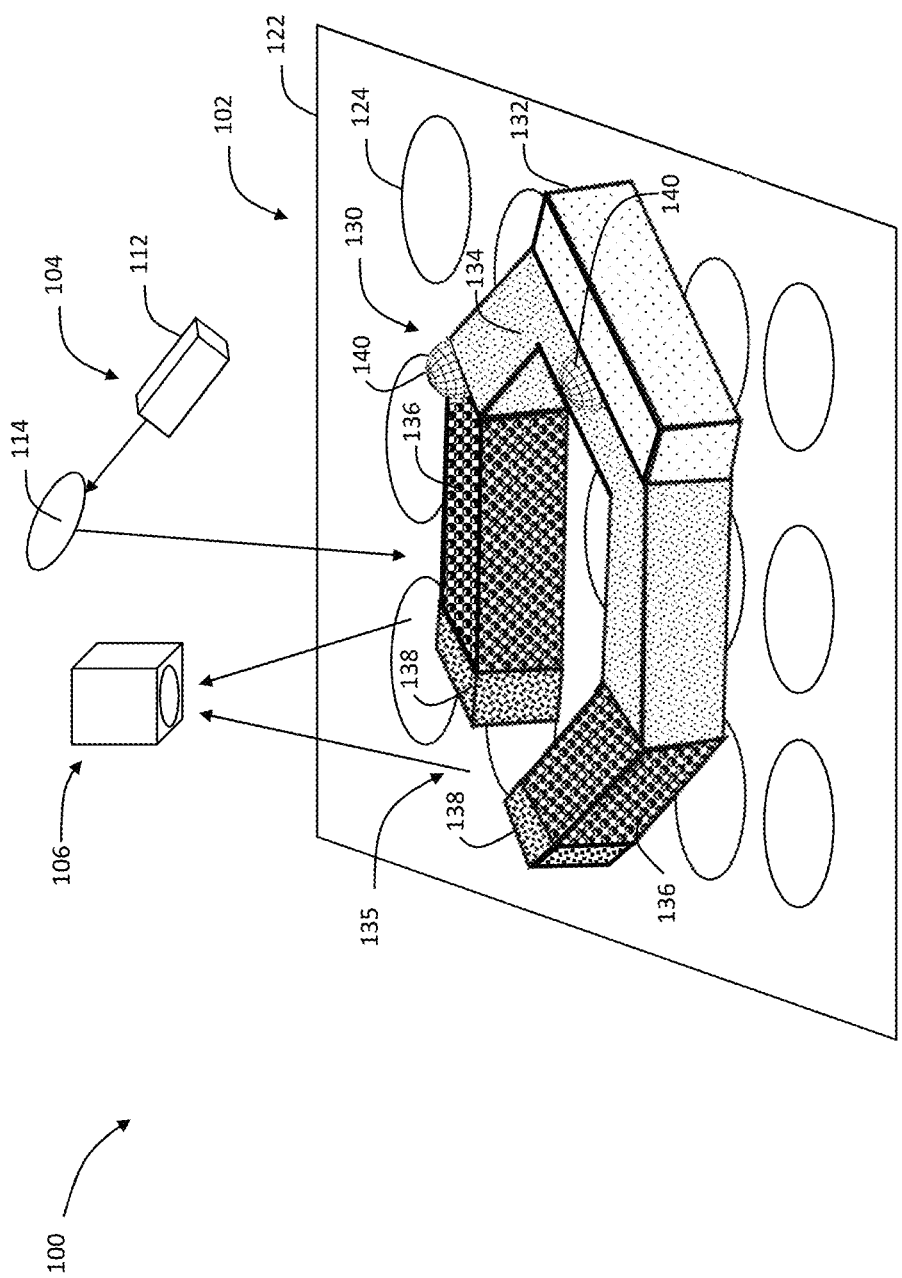
FIG. 1 is a perspective schematic of a microrobot system according to the present disclosure, including a microrobot structured light system, a three dimensional (3D) microrobot imaging system, a microrobot articulation system with integrated electrical coils, and a microrobot.

For the purposes of promoting an understanding of the principles of the present disclosure, reference will now be made to the embodiments illustrated in the drawings, and specific language will be used to describe the same. It will nevertheless be understood that no limitation of the scope of this disclosure is thereby intended.

In the present disclosure, the term "about" can allow for a degree of variability in a value or range, for example, within 10%, within 5%, or within 1% of a stated value or of a stated limit of a range.

In the present disclosure, the term "substantially" can allow for a degree of variability in a value or range, for example, within 90%, within 95%, or within 99% of a stated value or of a stated limit of a range.

Novel and advanced end-effector actuation designs and associated on-board sensing capabilities are provided in the present disclosure. These new capabilities allow designers of microrobots to more fully realize advantages of using these systems in various applications. In the present disclosure a new class of light responsive polymer magnetic microrobots (LRPMMs) with active end-effectors and dual mode sensing capabilities are described. To achieve simultaneous and independent control of a plurality of microrobots an embedded magnetic body is used which allows for using locally directed magnetic fields. As a result, and advantageously, navigation of the microrobots in a workspace is made possible. The active end-effectors are constructed from responsive polymers and actuated using structured light patterns. In order to use a vision-based force-sensing system as a first sensing mode, the polymer structures are initially calibrated. Additionally, electrochromic properties are embedded into the polymers providing a second sensing mode to detect electrical current levels in the environment through their change in color.

One of the challenge in realizing a mobile microrobot is constructing an effective power storage and locomotion system. Representative power and actuation mechanisms applied to mobile microrobots include electrostatic, thermal and optical, piezoelectric, biological, electromagnetic and combined piezoelectric-electromagnetic approaches. Electromagnetic systems using external magnetic fields are utilized, in accordance with the present disclosure. In implementing such a system, the microrobots are either made of permanent magnetic, ferromagnetic, or paramagnetic material. The resulting magnetic field applies a torque and a force to the microrobot on which it acts. In order to selectively control the force and torque, electrical current through a plurality of electromagnetic coils disposed about a workspace are modulated associatively.

In general two types of motion control are provided for the microrobots. First is a global motion control designed to move the microrobot about a micro-sized object, and second is a fine control designed to provide fine control as the microrobot manipulates the micro-sized object. A substrate, according to the present disclosure, with an array of planar micro-coils are configured to generate local magnetic fields for independent actuation of a plurality of microrobots. The microrobots are placed on the substrate and actuated independently by controlling the local magnetic field generated by the respective micro-coils in their vicinity. This configuration allows for the independent position and orientation control of the microrobots.

The second type of motion control is provided by soft passive end-effectors including photoactive liquid-crystal elastomers which are driven by structured light. The structured light fields allow for the low-level control over the local actuation dynamics within the body of microrobots made of these soft active materials. Structured light exposure are also used for shape-shifting soft microrobots into different configurations. Soft microrobots made from self-folding hydrogel bilayers are magnetically programmed to respond to external magnetic fields in order to locomote. Individual microrobots can be selectively addressed by NIR (near infrared) light and activated for shape transformation, yielding the microrobot's "shape" as an extra degree of freedom for control. Therefore, the dual modality includes use of magnetic fields in the system according to the present disclosure for position and orientation control of microrobots, while structured light are used for end-effector actuation control. This approach allows for independent control of selective control of the microrobots in the same workspace.

The LRPMMs according to the present disclosure include active compliant end-effectors with calibrated stiffness values. According to one embodiment, the active end-effectors are made of a thermo-responsive polymer embedded with an assembly of gold (Au) nanorods (NR), which when shown with structured light heat up and generate a thermo-responsive reaction. Targeted structured light patterns can then be directed to the end-effectors, heating up the Au nanorods and causing the polymer to respond and thereby actuate the end-effector.

Additionally, optical tracers are provided in the end-effectors. A 3D optical system tracks the relative displacements of optical tracer features on the LRPMMs to generate real-time micro-force information. Furthermore, electrochromic polymer regions are added to the tips of the end-effector. These polymer regions are used to sense electrical characteristics (e.g., current levels) in the environment (e.g., cells) as these polymers will change color in presence such electrically changing environment.

Referring to FIG. 1 a microrobot system 100 is shown. The microrobot system includes three subsystems: 1) a microrobot articulation system 102, 2) a microrobot structured light system, and 3) a microrobot vision system. The microrobot articulation system 102 includes a substrate 122 and a plurality of micro-coils 124 arranged on the substrate, where one or more of the micro-coils 124 are adapted to be selectively activated, thereby requiring selective connectivity (not shown), known to a person having ordinary skill in the art. The microrobot articulation system 102 also includes one or more microrobots 130. It should be appreciated that the substrate 122 shown in FIG. 1 (and later in FIG. 7, see below) is different than the substrate 802 shown in FIG. 8, where a process of fabrication of one section of the microrobot 130 is presented. However, similar material listed with respect to FIG. 8 for the substrate 802 can be used, including plastics and glass. It should be further appreciated that while one microrobot 130 is shown, a plurality of microrobots 130 can be placed on the substrate 122 and work in concert with each other in order to accomplish a task. The microrobot 130 includes a magnet 132, a support member 134 coupled to the magnet 132, a pair of thermo-responsive polymer members 136 coupled to the support member 134 each at a proximal end of the thermo-responsive polymer member 136, and a pair of electrochromic polymer members 138, each coupled to a corresponding thermo-responsive polymer member 136 at a distal end. The microrobot 130 also includes one or more optical tracers 140.

As discussed above, the micro-coils 124 disposed on the substrate 122 provide the motive forces to move the microrobot 130 about the substrate 122. These movements are considered as large-scale movements. By selectively activating one or more of the micro-coils 124, precise motion of the microrobot 130 can be achieved. According to another embodiment discussed below with respect to FIG. 7, external micro-coils can be used in place of the substrate 122 and micro-coils 124. In this embodiment while individual micro-coils can be activated individually, these act as global coils and thus provides less selective control for the microrobots. Once in the desired location, fine-tuned motions of the thermo-responsive polymer members 136 can be achieved by applying structured light via the microrobot structured light system 104. The structured lights provided by the microrobot structured light system 104 heats up gold disposed inside the thermo-responsive polymer member 136 causing them to change shape (i.e., provide fine movement). When applying the microrobot system 100 to biological applications, it is important to finely tune the structured light (e.g., laser pulse) using various parameters such as laser pulse intensity, on time, off time, polarization, to avoid harming the biological entities of interest. Irradiation-induced temperature by an 808 nm NIR laser operating in a temperature range of about 42 to about 47° C., has been shown to avoid destroying tumor cells. The electrochromic polymer members 138 are configured to change color when coming in contact with an object having a potential, e.g., a cell (not shown). The microrobot vision system 106 is configured to monitor the microrobot 130 and detect color changes of the electrochromic polymer members 138 when they come in contact with or are coupled to an object with electrical potential.

The controlled light patterns locally excite a hyperthermia agent including gold (Au) nanorods (NR) embedded into the thermo-responsive polymer members 136, leading to a fine control of end-effector 135 by actuation of the end-effector 135 and therefore conferring an extra degree of freedom for control to the microrobot 130. The electrochromic polymer members 138 are configured to both sense electrical characteristics of the micro-sized object they come in contact with or are coupled to as well as provide an accurate functionalization to load the body of the microrobot 130 with drugs for targeted delivery by inclusion of molecular imprinting polymers in the electrochromic polymer members 138.

The microrobot 130 of the present disclosure and particularly the end-effector 135 provide a dual sensing modality: (i) deformation of the end-effector 135 based on the stiffness calibrated elastic structure can be used to sense manipulation forces and can be evaluated to determine the stiffness of certain materials of interest (e.g., tumor cells) or to allow for force-controlled micromanipulation of micro-sized object and/or biological entities by measuring location of optical tracers 140 using the microrobot vision system 106; and (ii) the integration of electrochromic polymers for in situ optical sensing of electrical currents (conductivity), as described above. In addition, when working with cells, the cell outer morphology and deformation due to the applied microforces can also be finely determined by the microrobot vision system 106.

The electrochromic polymer used in the electrochromic polymer members 138 provide high coloration efficiency and rapid switching ability. Their switching time is dependent on the redox reaction efficiency, which depends on the ions diffusion rate and the conductivity. Certain classes can even have two reduction-oxidation states, generating multiple colors. The electrochromic polymer members 138 can be configured to have photopatternable electrochromic polymer integrated into regions at the tips of the end-effector 135 actuator in order to observe in situ current levels or changes once the microrobot 130 is in contact with the object of interest (e.g., cell membranes).

Each of the sensing modes described above needs to be calibrated in order to return useful information. For the vision-based micro-force sensing mode (mode (i)), the stiffness of the compliant portion of the microrobot 130 needs to be experimentally tested. To accomplish this task a micro-force sensing probe (e.g., FT-S1000, resolution 0.05 µN@10 Hz, found at www.femtotools.com) can be used. With the micro-force sensing probe mounted to a micromanipulator system, the combination can translate along x, y, and z directions independently with high resolution, thus leveled and flushed with the end-effector 135 for testing. During the calibration test, the deflection of the end-effector 135 by monitoring positions of the optical tracers 140 brought upon by the micromanipulator is recorded in real-time, which provides a correspondence between the deflection of the end-effector 135 and the forces applied thereto. Therefore, the stiffness of the end-effector 135 can be derived by this deflection and the blocking force read by the micro-force sensing probe. The stiffness with respect to various axes can be calibrated separately, thereby generating linear or non-linear stiffness curves which can be fit into polynomials, as needed. In a similar manner, the electrical current sensing ability for the end-effector 135 can also be tested by mounting the electrochromic polymer members 138 to a fixed location in contact with a test fixture. By applying a known fixed voltage and/or current between the electrochromic polymer members 138, color changes are recorded by the microrobot vision system 106 to generate a correspondence.

The microrobot vision system 106 utilized a digital fringe projection (DFP) technique which utilizes sinusoidal structured patterns to retrieve 3D information from the carried phase rather than intensity information. Since these patterns have intensities that vary continuously from point to point, they boost the structured light techniques from projector-pixel resolution to camera-pixel resolution.

Figure 2:
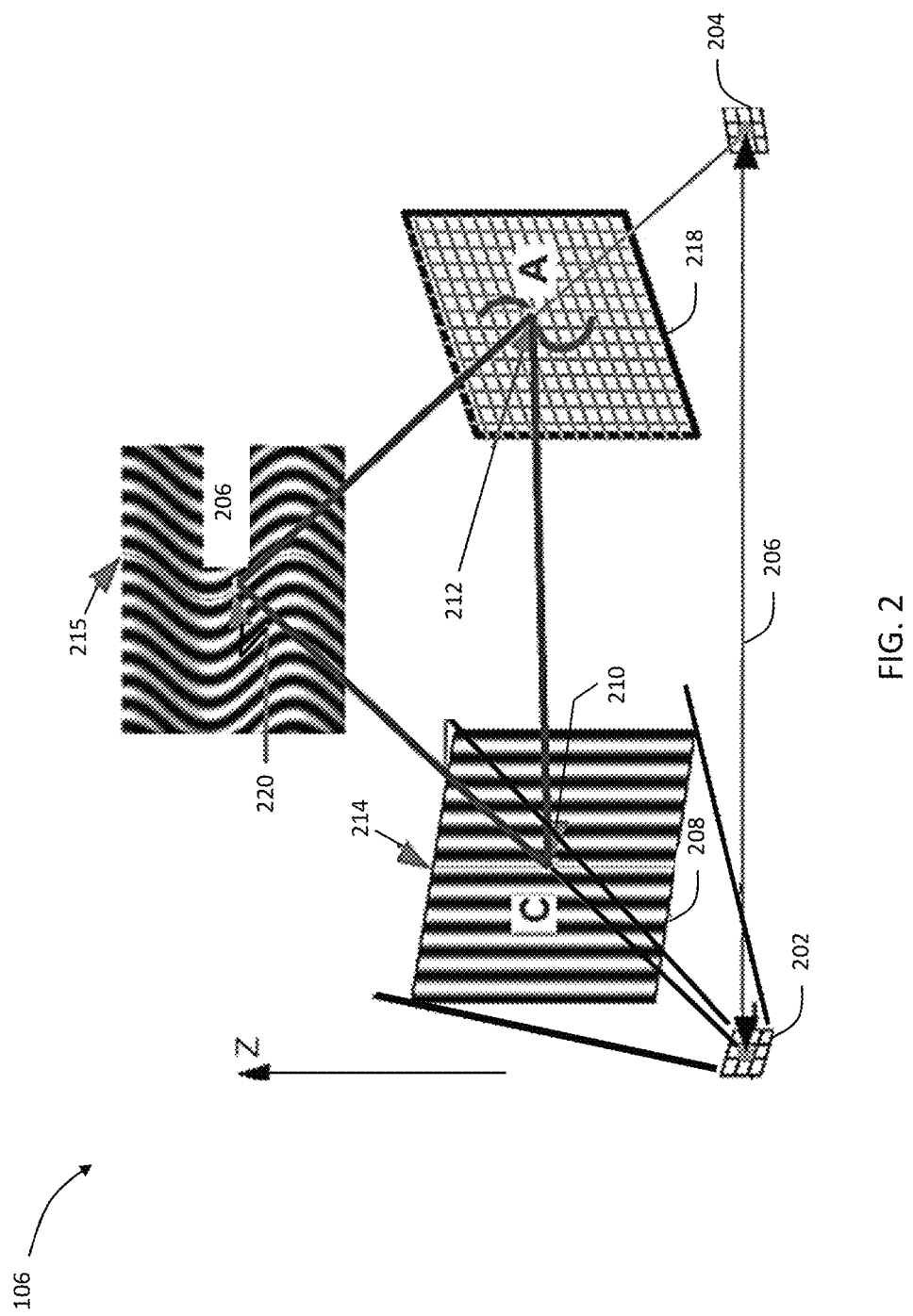
FIG. 2 is a schematic representation of the three dimensional (3D) microrobot imaging system of FIG. 1.

Referring to FIG. 2, a schematic diagram of a 3D perception system based on a DFP technique used in the microrobot vision system 106 is presented. The microrobot vision system 106 includes a projection unit 202, an image acquisition unit 204, and a 3D object 206 which together form a triangulation base. The projector unit 202 shines a projection fringe 208 made up of vertical projector phase lines 214 onto the 3D object 206 at a first angle (not called out). The 3D object surface distorts the fringe images from the projector phase lines 214 into curved object phase lines 215. The image acquisition unit 204 captures the distorted fringe image (i.e., the distorted object phase line 215) from a second angle (not called out). In such a system, the correspondence is established by analyzing these fringe patterns through fringe analysis techniques by comparing known location of a projection pixel 210 with that of a known location of an image acquisition pixel 212 to ascertain location of an object point 220. In so doing a baseline 216 is established between the projection unit 202 and the image acquisition unit 204. These aforementioned relationship results in a camera image 218.

The phase-shifting technique discussed above uses a sinusoidal fringe that is shifted spatially from frame to frame with a predetermined phase shift. Analyzing a set of phase-shifted fringe images yields the phase that can be converted to 3D coordinates. The phase-shifting based techniques have the following advantages: high measurement speed, since only three fringe images are required to recover one 3-D frame; high spatial resolution, since the phase (and hence the depth) can be computed pixel by pixel; less sensitivity to surface reflectivity variations since the phase calculation automatically cancels them out; and naturally captures pixel-by-pixel aligned 2D texture on top of 3D geometry.

With the microrobot vision system 106 described, an explanation of how this system is applied to force sensing modality is now presented. To determine the micro force that the active end-effector applies the object, the relative geometric deformation between a compliant point and a rigid point on the body of the microrobot 130 is obtained in real time. In so doing the microrobot vision system 106 simultaneously captures both a compliant point (i.e., a part of the body of the microrobot 130 that deforms) and a rigid base. This is accomplished by focusing on the optical tracers 140 as complaint points. Since the compliant optical tracer 140 includes features that are at microscale, the microrobot vision system 106 focuses on surfaces through a microscopic system to achieve microscale spatial resolution.

Figure 3:
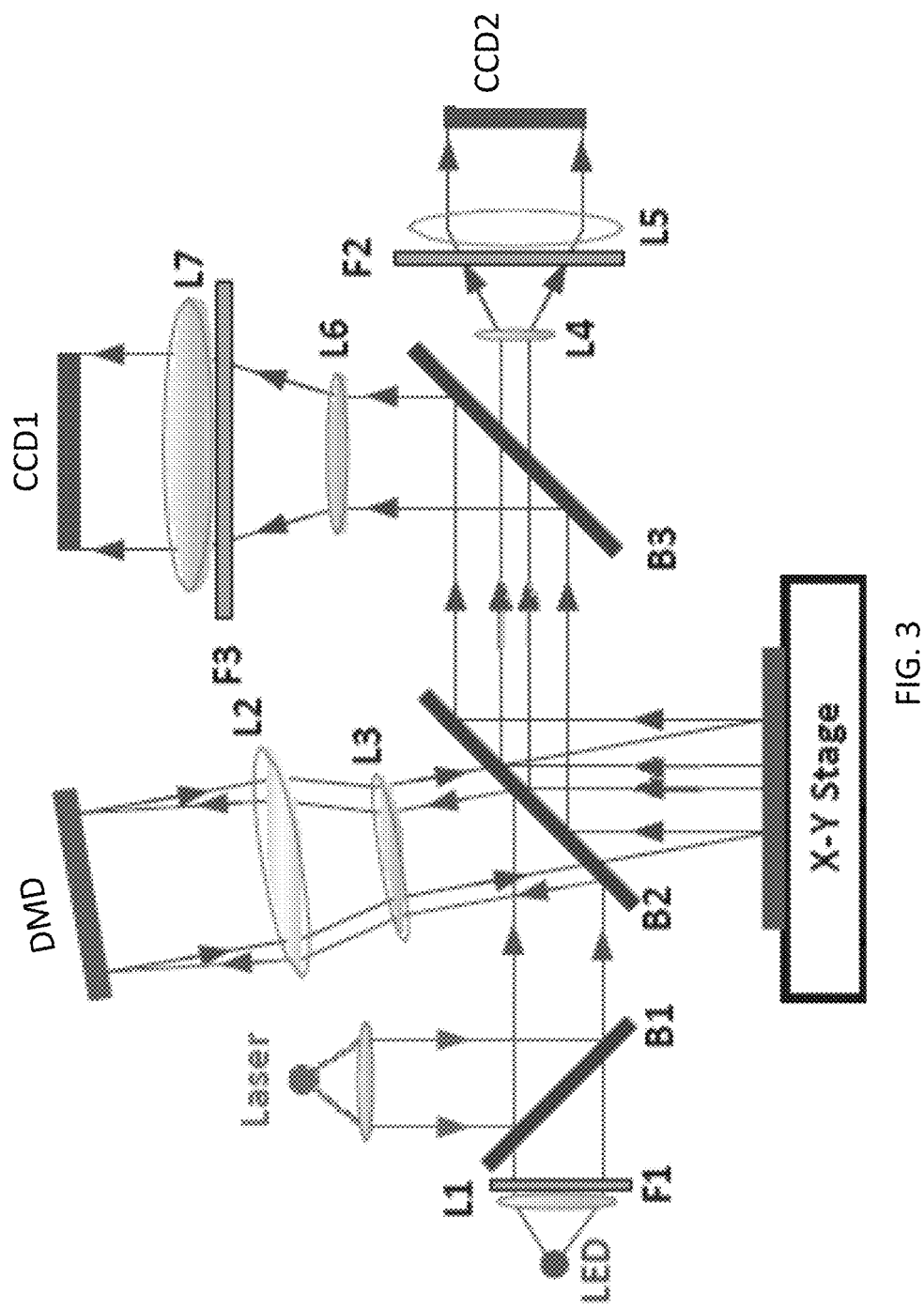
FIG. 3 is a schematic representation of optical components used in the microrobot imaging system of FIG. 1.

Referring to FIG. 3, a schematic is provided to depict a multi-resolution 3D perception system. A light emitting diode (identified as "LED") is a light source, and the light from the LED is collimated by a lens (identified as "L1") on the surface of a digital micro-mirror device (identified as "DMD"), where the images is formed. Light that is reflected from the DMD will first be focused by a lens (identified as "L2") and collimated by a lens (identified as "L3") to a smaller surface area. The focused-collimated light then passes through a beam splitter (identified as "B2") onto a sample surface placed on an X-Y stage. The sample surface is placed at a slightly out-of-focal plane of the projection lenses L2/L3 to produce high-quality phase. A reflected images from a slightly different angle is captured by the camera for 3D reconstruction. Because of the high spatial resolution (e.g., 1 μm), high temporal resolution (e.g. 30 Hz), and high depth resolution (i.e., nm to sub μm) requirements for actuation point capture, a 10-bit or 12-bit CCD camera is used. To roughly locate where a microrobot is, it does not require as high resolution perception as estimating microscale deformations for force sensing. Therefore, according to one embodiment of the present disclosure, two real-time cameras (CCD1 and CCD2) that can simultaneously capture the reflected images through imaging lens systems L4/L5 and L6/L7 with different magnifications can be used. The high-resolution (high-magnification) camera CCD2 captures the smaller area for the individual robot, where the force is to be estimated, whilst the low-resolution camera CCD1 captures the entire scene including multiple microrobots 130.

The same microrobot vision system 106 is also used to achieve sub-diffraction limit 3D tracking, provide feedback for micromanipulation and assembly tasks, and reconstruct the workspace for human operators. Before any microrobotic task starts, the overall snap-shot of the scene is reconstructed using the high-resolution 3D sensing system to understand the state of the robots and scene landmarks. An XY stage operated by a human operator is used to move the scene around to acquire the snap-shot image. The captured data is then used to generate 3D data that represents the entire scene, the location and orientation of the microrobot 130, as well as any landmarks.

When executing microrobotic tasks, a real-time tracking is needed to ascertain the location and orientation of the robot, and the geometric deformation of the robot. The first step of tracking is to perform image segmentation to separate the robot from the background. Removing background can be accomplished with the aid of the 3D sensing subsystem (described above) since the background scene has a different depth. Segmenting the robot is also possible because of its unique geometric and texture features. However, the tracking accuracy (i.e., nm to sub-μm) presents a challenge since it goes beyond the optical diffraction limit for the visible light spectrum. To achieve sub-diffraction limit tracking accuracy and reduce the measurement uncertainty, use of computer aided design (CAD) files of robots and their possible deformations is made. To do this, 3D captured data can be registered against the ideal CAD geometry from which the orientation and location can be more precisely determined. To accomplish this, an extended version of particle filtering method known by a person having ordinary skill in the art combined with a non-rigid registration method using harmonic maps, also known to a person having ordinary skill in the art is used. Here, registration between input data and the deformed CAD geometry occurs through minimization of an energy function that accounts for both depth and surface normal information. Simulated annealing, known to a person having ordinary skill in the art, can be integrated such that multiple model hypotheses are recursively tested and pruned to ensure a solution at the global minimum. Since optical tracers 140 on the microrobot 130 require to be tracked with the highest possible accuracy, a colored PNIPAM structures and the color-expressing patterns are used to further reduce the measurement uncertainty, and use the 2D color texture that naturally comes along with the 3D perception system to further increase tracking accuracy.

The high-accuracy and real-time tracking provides the (x, y, z) coordinates in space of the desired actuation points on microrobots 130. The (u, v) coordinates of the corresponding points on the DMD (see FIG. 3) can be mathematically computed through back-projection (e.g., from the 3D (x, y, z) coordinates in space to the 2D (u, v) coordinates on the DMD chip). To simplify the system design and calibration, the same DMD is used for both sensing and actuation. Since the same DMD is used for sensing and actuation, the mapped (u, v) coordinates on the DMD chip can be activated to actuate the point. To actuate the material, the NIR laser light is preferable due to its narrow spectrum. For high-accuracy 3D sensing, broadband light (e.g., LED) is preferable because it avoids coherent laser light associated problems (e.g., speckle noise). As shown in FIG. 3 the second light source, a laser is used for structure illumination. The laser light is collimated by a lens system L8, and combined with LED light through the beam splitter B1. To avoid interference between sensing LED light and actuation light (laser), notch filters (F1, F2, and F3) are used. The notch filters block the laser spectrum from the LED light source such that the cameras do not see the laser light, and actuation is not affected by LED light.

During sensing, the DMD acts as the projection device of the structured light system; while during actuation, the DMD only turns on those pixels that are mapped from desired actuation locations. For applications where sensing and actuation take comparable time, a second DMD can be added, where the first DMD is used for sensing and the second one is used for actuation. The mapped (u, v) coordinates for actuation can be determined on the second DMD once the second DMD is calibrated under the same coordinate system as the 3D sensing system.

Figure 4C:
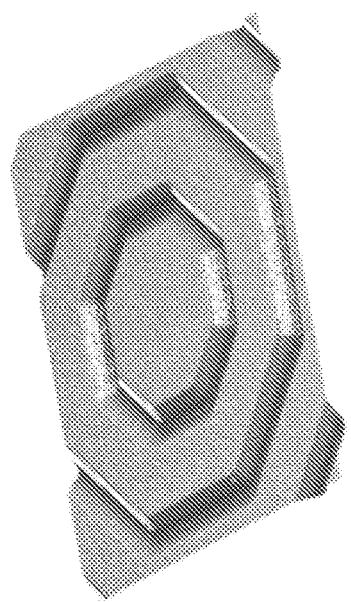
FIGS. 4B and 4C represent microstructures measured by the system shown in FIG. 4A.
Figure 4B:
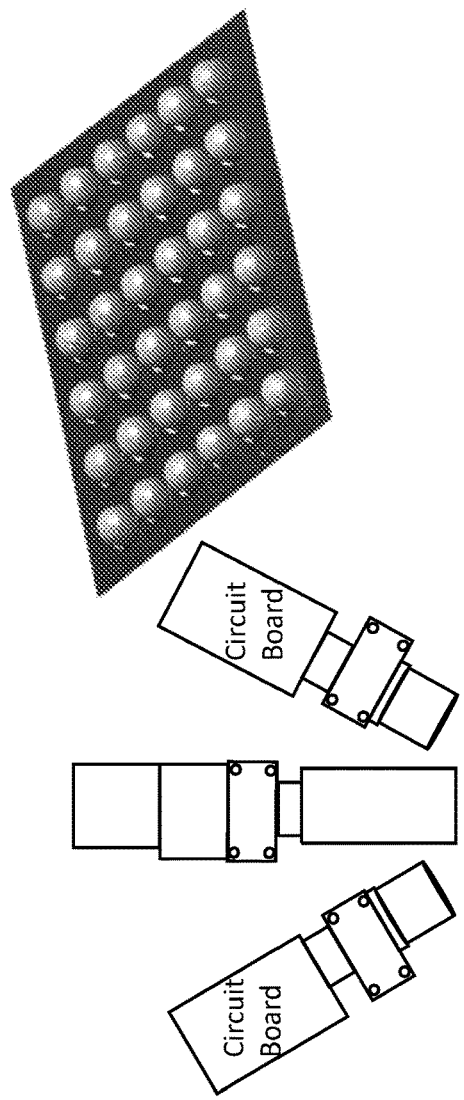
Figure 4A:
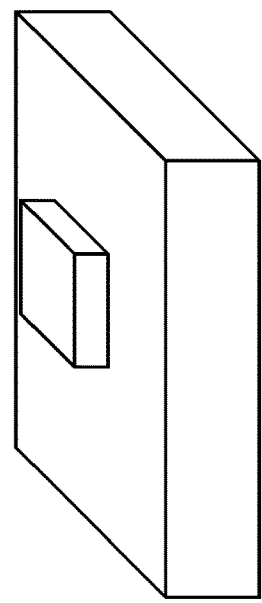
FIG. 4A is a photograph of an experimental setup for measuring microstructures.
Figure 5A:
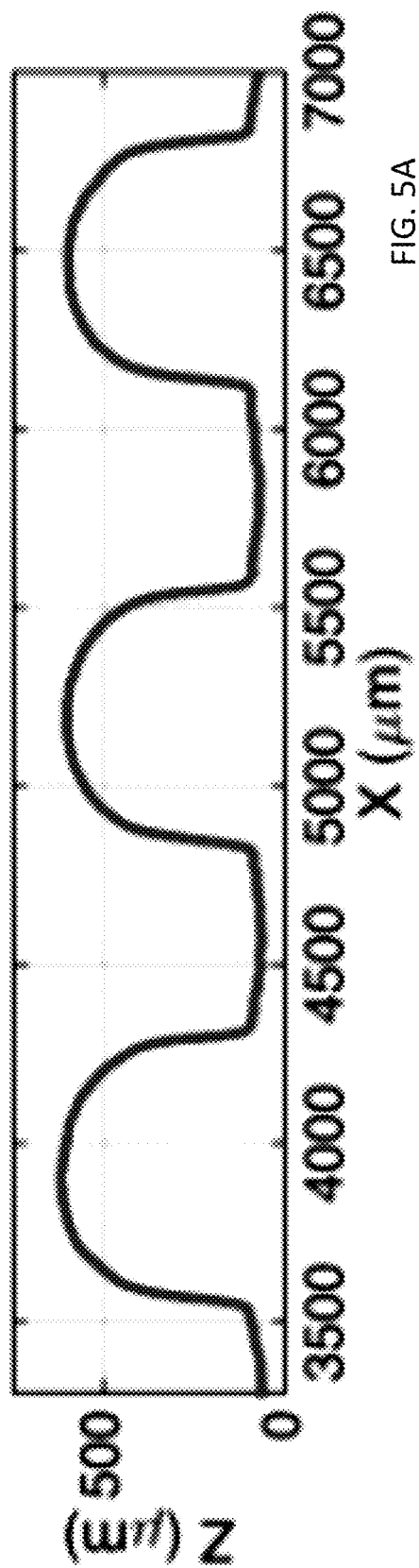
FIGS. 5A and 5B represent dimensions of the microstructures of FIGS. 4B and 4C, respectively, measured by the system shown in FIG. 4A.
Figure 5B:
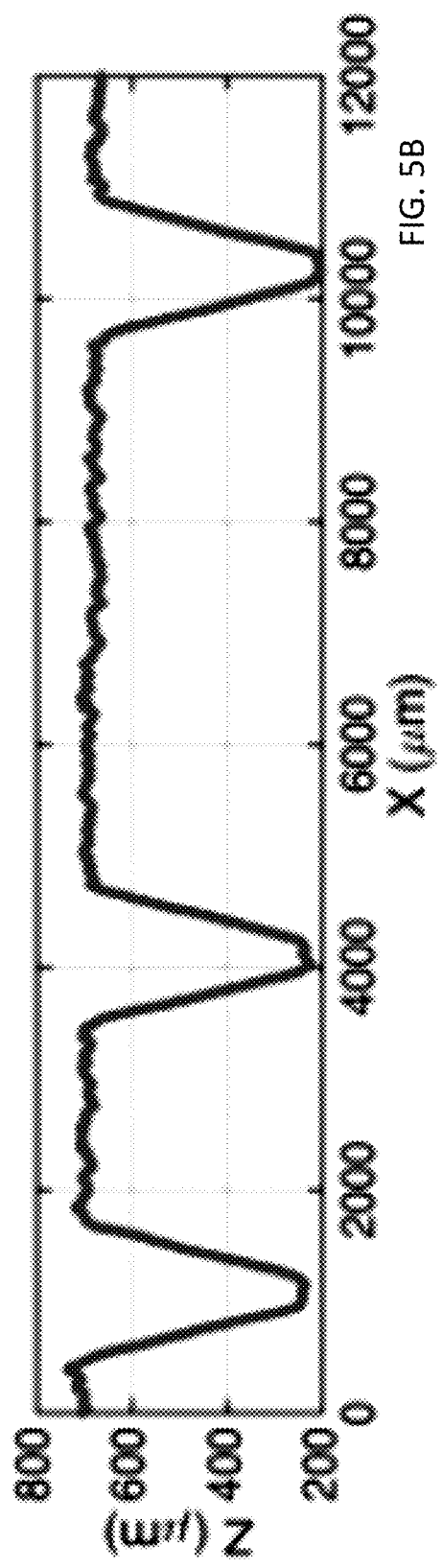

A prototype system for 3D optical sensing has been reduced to practice that can achieve a spatial resolution of about 10 μm and a depth resolution of about 1 μm. The achieved measurement speed is about 30 Hz. Referring to FIG. 4A, a photograph representation of the exemplary system is shown. The system of FIG. 4A uses two DLP projectors and one camera to minimize shadow issues, utilizing a real-time 3D sensing software package. It should be appreciated that the entire field of view (FOV) for the system shown in FIG. 4A is about 12 mm by about 10 mm. FIG. 4B shows a 3D microstructure processed by the system of FIG. 4A. FIG. 5A represents a graph of Z vs. X both in μm from the measurement of the 3D structure shown in FIG. 4B. FIG. 4C shows another 3D microstructure processed by the system of FIG. 4A. FIG. 5B represents a graph of Z vs. X both in μm from the measurement of the 3D structure shown in FIG. 4C.

Figure 6:
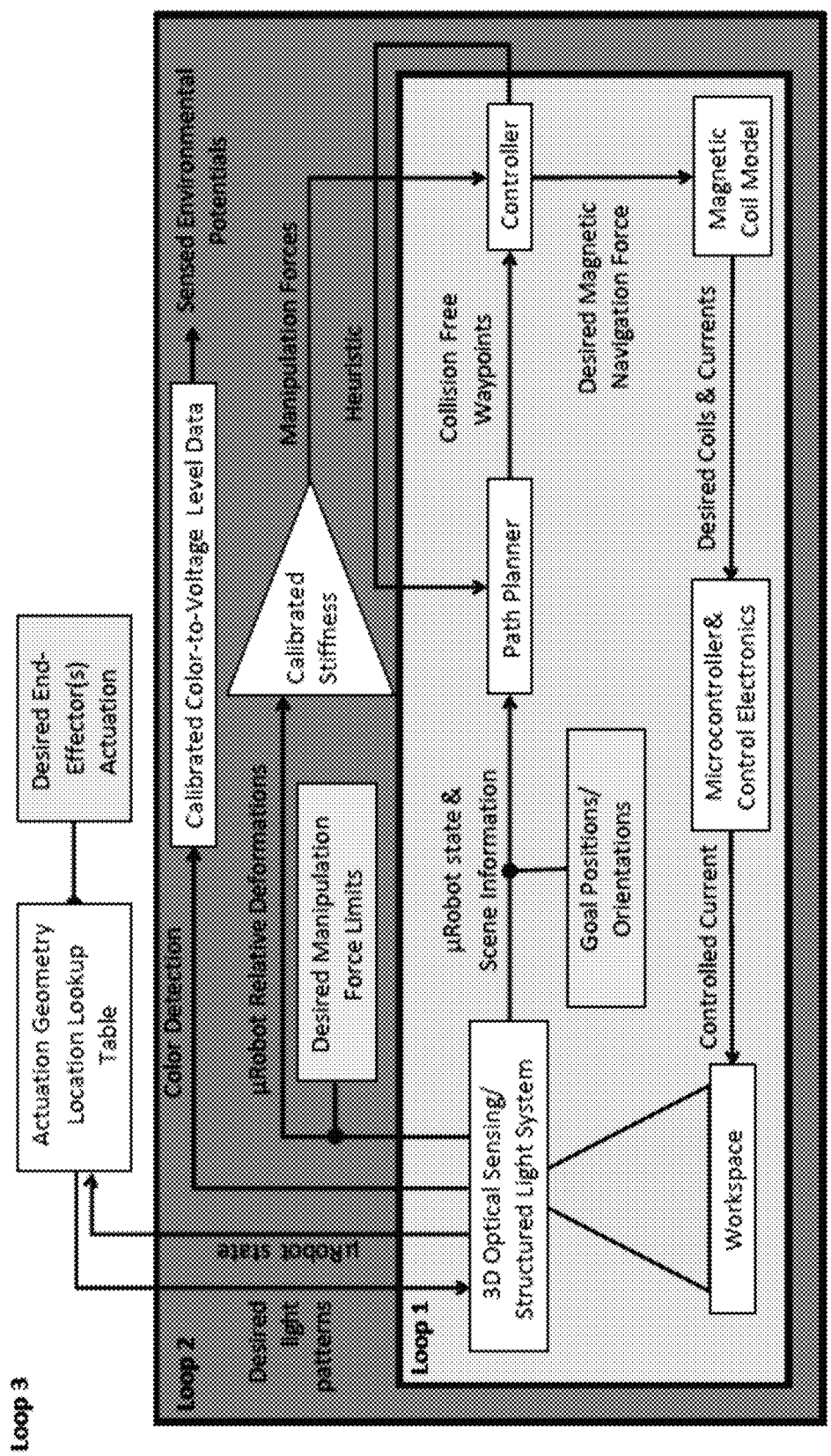
FIG. 6 represents a block diagram of a control mechanism for the microrobot system of FIG. 1.

Three nested control loops are used for the autonomous control of microrobots 130, as shown in FIG. 6. Loop 1 is a position/orientation (state) control loop that is used to move an microrobots 130 from a current state to a goal state in the workspace. The optical system provides the necessary feedback to determine the current state of the microrobots 130. This information will be fed into a standard heuristic-based path planning module. A controller is invoked next to determine the appropriate magnetic navigation forces for the robot. Proportional integral (PI) and proportional integral and differential (PID) controllers are used initially. A model of the magnetic coil system can be used to determine what coils to activate and with what amount of current to apply to each coil (whether micro-coils 124, as seen in FIG. 1, or off-substrate coils as discussed below). This information is then routed to the hardware system microcontrollers and control electronics to output the controlled current amount to the external coils surrounding the workspace. Loop 2 is the dual-mode sensing loop, discussed above. For manipulation with force control, the desired force limits are given as input to the overall control system. The optical system will detect the deformation of the compliant portion of the microrobots 130 in real-time and feed this information to the calibrated stiffness data for the microrobots 130. From this calibrated data, the actual manipulation forces will be determined and sent to the controller. The controller will then determine if these force levels violate the preset limits or not. If not, the position/orientation control loop continues uninterrupted. If they do, the controller will have the microrobots 130 back off of their current trajectory and then use a heuristic approach to re-plan a new route. For sensing voltage levels in the environment, the optical system will simply detect the color and color changes of the microrobots 130 and use the calibrated data to determine the corresponding sensed voltage. This information can also be fed back into the controller, if needed, depending on the application. Finally, Loop 3 is used to control the actuation of the microrobots 130 end-effector 135 with the microrobot vision system 106. It takes the desired positions of the end-effector 135 as the input. This and the detected state information for the microrobots 130 is combined with a lookup table including of what regions on the end-effector 135 to actuate to perform a desired behavior. From this information, the desired light patterns are determined and then executed with the structured light system. This loop can run along with a combination of one or both of the other control loops or by itself.

Figure 7:
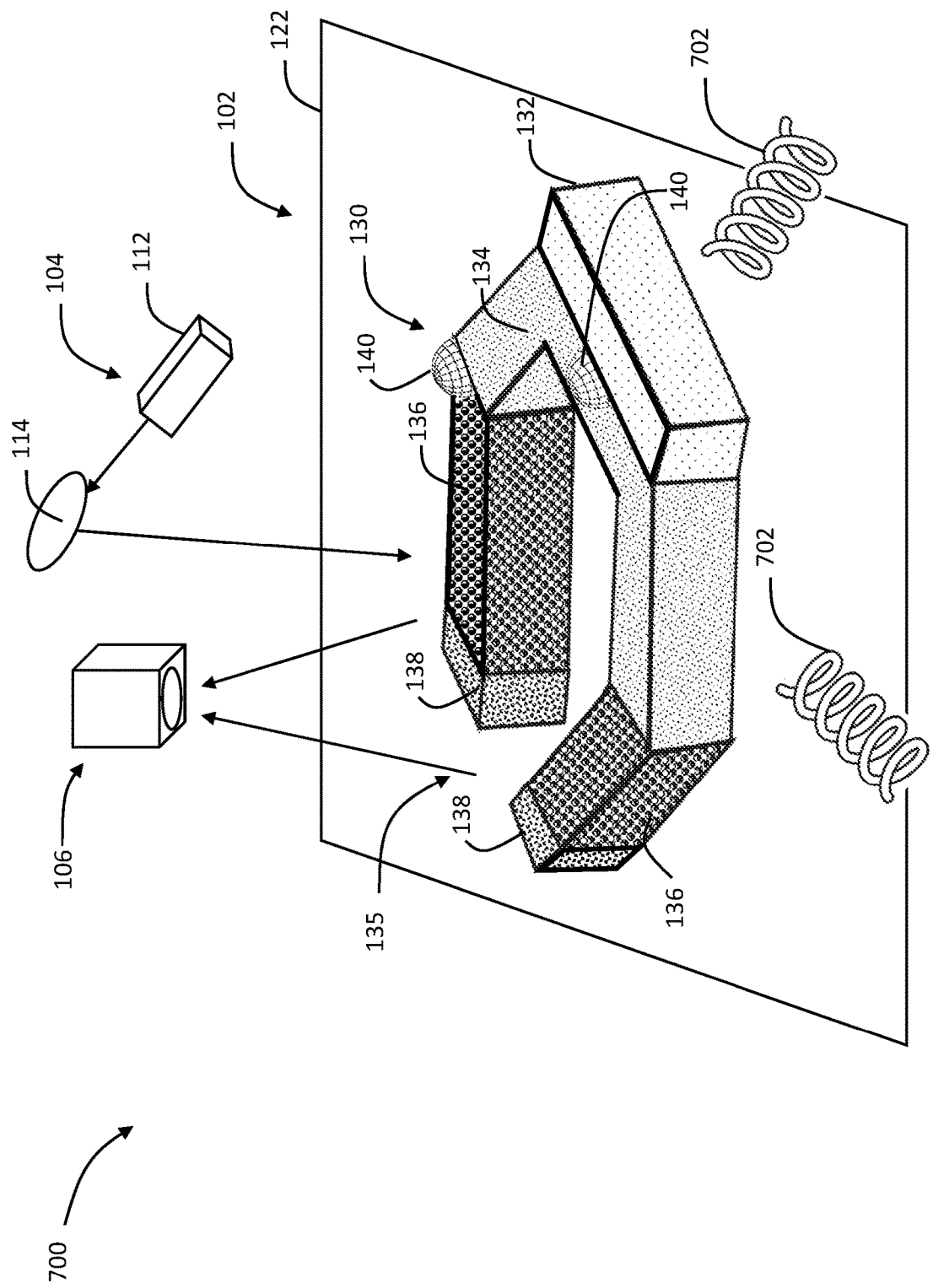
FIG. 7 is a perspective schematic of another microrobot system according to the present disclosure, including a microrobot structured light system, a three dimensional (3D) microrobot imaging system, a microrobot articulation system with external electrical coils, and a microrobot.

As discussed above, the embodiment shown in FIG. 1, can be varied by removing the integrated micro-coils 124 from the substrate 122 and replaced with external coils. This embodiment is shown in FIG. 7, with all the reference numerals kept the same except the microrobot system 700 and micro-coils 702. One or more (e.g., 4 or 8) micro-coils 702 can be used to generate the motive force for the one or more microrobots 130. These micro-coils 702 can be controlled globally or selectively.

The microrobots 130 according to one embodiment are sized to be have a maximum size of about 1 mm by about 1 mm by about 300 um. The microrobots 130 according to one embodiment are configured to manipulate objects that range in size from about 1 um in diameter to about 1 mm in diameter. The microrobot system 100 or 700 of the present disclosure is configured to sense forces on the range of about 1 μN to about 500 μN with sub-μN resolution. The microrobot system 100 or 700 of the present disclosure is configured to apply forces on the range of about 1 μN to about 500 μN with sub-μN resolution. The microrobot system 100 or 700 of the present disclosure is configured to sense voltage potentials on the range of about −1000 mV to about +1000 mV with about 5 mV resolution. The fine-tuned movements generated from the Thermo-responsive polymer members range from about 1 μm up to about 500 μm, with sub-micron resolution.

In an alternative embodiment (not shown), the microrobot 130 may include only one thermo-responsive polymer member 136 attached to only one end of the support member 134. In this embodiment, the finetuned movement of the microrobot 130 is achieved with only one thermo-responsive polymer member 136 on one side of the end-effector 135 and against the support member 134 on the other side of the end-effector 135. In this embodiment, one electrochromic polymer member 138 is coupled to the support member 134 and the other coupled to thermo-responsive polymer member 136.

Figure 8:
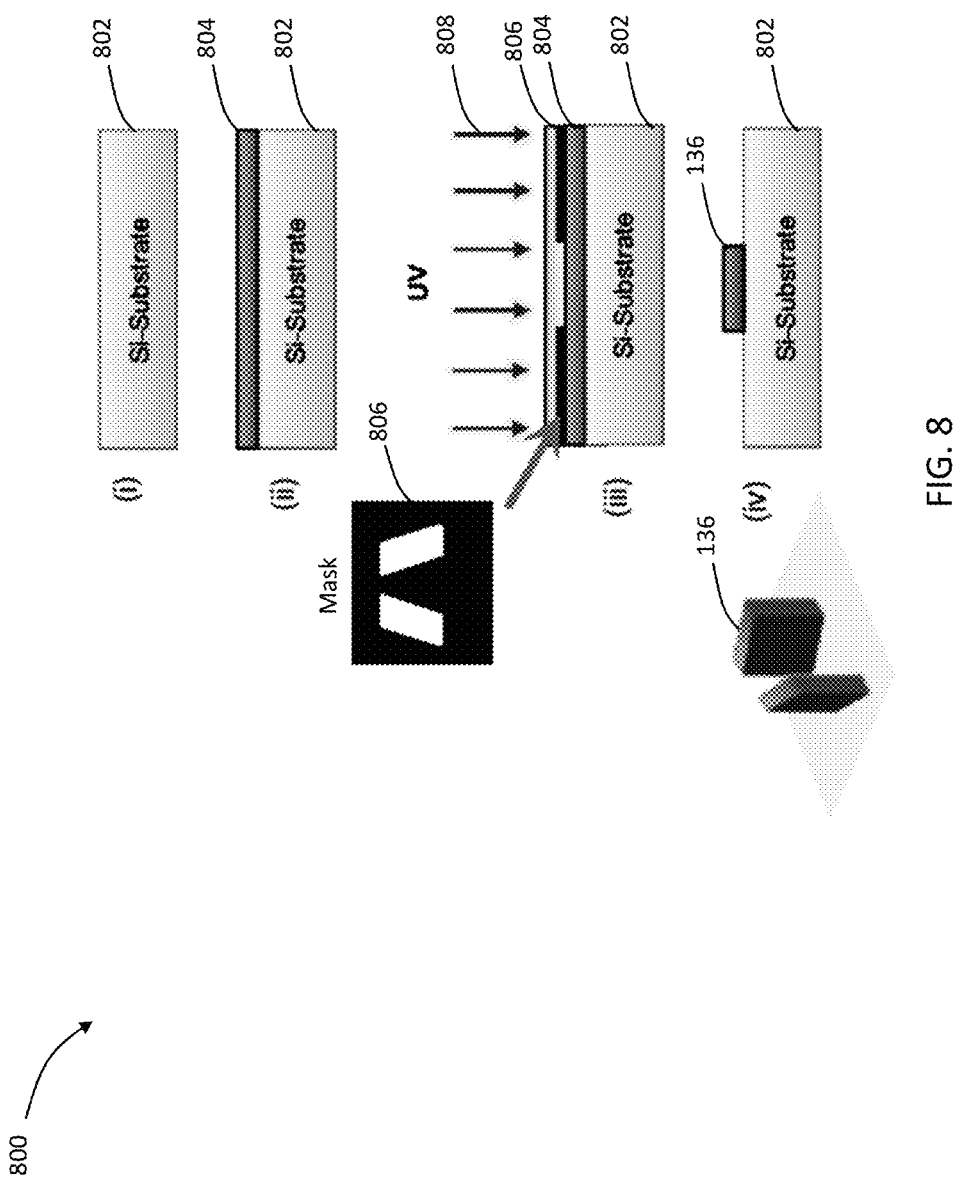
FIG. 8 represents a schematic of a process of fabricating a polymer section of the microrobots of FIGS. 1 and 7 using a photolithography process.

The microrobot 130 shown in FIG. 1 can be manufactured using photolithography processes as provided below. A photolithography mask can be designed for the different sections of the microrobot. The sequential deposition and exposure of the different provide the microrobot 130 presented in FIG. 1. Referring to FIG. 8, a photolithographic process 800 for generating the polymer end-effector 135 of the microrobot 130 is shown. However, similar steps define the regions made of the other sections in the microrobot 130. In FIG. 8, the top panel identified as "(i)" shows a temporary substrate 802 (not the same as substrate 122 shown in FIGS. 1 and 7—the device is lifted off of the temporary substrate 802 upon fabrication). The substrate 802 can be any suitable substrate known to a person having ordinary skill in the art. For example, the substrate 802 can be silicon, silicon dioxide, glass, sapphire, germanium, gallium arsenide, indium phosphate, alloys of silicon and germanium, titanium oxide, single polymer, such as polyethylene (PE), biaxially oriented polypropylene (BOPP), polyethylene terephthalate (PET), polyvinyl chloride (PVC) and the like including flexible substrates. Next, as provided in the panel identified as "(ii)", a layer of a material 804 corresponding to the section of the microrobot 130 (e.g., the support member 134, the thermo-responsive polymer member 136, the electrochromic polymer member 138) is deposited on the substrate 802. For the support member 134 the material 804 can be SU-8, silicon, silicon dioxide, glass, sapphire, germanium, gallium arsenide, indium phosphate, alloys of silicon and germanium, titanium oxide, single polymer, such as polyethylene (PE), biaxially oriented polypropylene (BOPP), polyethylene terephthalate (PET), polyvinyl chloride (PVC) and the like. For the thermo-responsive polymer member 136, the material 804 can be PNIPAM, previously functionalized to be a photopatternable PNIPAM and which also includes gold nanorods (Au-NR), in which they act as a hyperthermia agent, which in the presence of photon energy will convert light energy into heat. Alternatively, a gold nanolayer can be used for the same purposes. For the electrochromic polymer member 138, a variety of different materials and chemistries (e.g., Alkyl and alkoxy substituted poly(propylenedioythiophene)) are suitable as long as the structure is photopatternable, as known to a person having ordinary skill in the art. Next, as provided in the panel identified as "(iii)", a mask 806—different masks 806 are utilized for different sections of the microrobot 130—is placed on the material 804 and light (e.g., ultraviolet light) 808 is shown on the mask 806, to etch away portions to be removed and maintain portions to be preserved. Thereafter, as provided in the panel identified as "(iv)", the corresponding portion (e.g., the support member 134, the thermo-responsive polymer member 136, the electrochromic polymer member 138) remains on the substrate 802. The process is repeated until all sections of the microrobot 130 are constructed. A magnetic body (e.g., nickel) is added as a posteriori to the microstructure as the magnet 132. Finally, the 3D optical sensing tracer features, shown in FIG. 1, are added to the structure by e.g., an ink-jet printing process using various color or an additional photo- or two-photon lithography step followed by the sputtering of a thin layer of germanium.

Those having ordinary skill in the art will recognize that numerous modifications can be made to the specific implementations described above. The implementations should not be limited to the particular limitations described. Other implementations may be possible.

The invention claimed is:

1. A microrobot system, comprising:
    a microrobot structured light system, comprising a structured light source adaptable to selectively shine structured light;
    a microrobot vision system adaptable to ascertain position and color of an object; and
    a microrobot articulation system, including:
        a substrate,
        one or more electrical coils each adaptable to provide a magnetic force in an XYZ coordinate system,
        one or more microrobots disposed on the substrate, each microrobot including:
            a magnet upon which the magnetic force of the one or more electrical coils act,
            a support member coupled to the magnet,
            a thermo-responsive polymer member coupled to each end of the support member at a proximal end, the thermo-responsive polymer member configured to articulate when heated,
            wherein the thermo-responsive polymer members configured to receive light from the microrobot structured light system and convert the received light into heat.

2. The microrobot system of claim 1, wherein the one or more electrical coils are external to the substrate.

3. The microrobot system of claim 1, wherein the one or more electrical coils are integrated into the substrate.

4. The microrobot system of claim 1, where each microrobot further comprises an electrochromic polymer member coupled to a distal end of the thermo-responsive polymer member, the electrochromic polymer members configured to change colors when coupled across an object having an electrical potential.

5. The microrobot system of claim 1, wherein the thermo-responsive polymer member includes PNIPAM.

6. The microrobot system of claim 1, the thermo-responsive polymer members include gold nanorods.

7. The microrobot system of claim 1, wherein the magnet is made of permanent magnetic, ferromagnetic, or paramagnetic material.

8. The microrobot system of claim 1, wherein the substrate is made from one or more of silicon, silicon dioxide, glass, sapphire, germanium, gallium arsenide, indium phosphate, alloys of silicon and germanium, titanium oxide, polyethylene (PE), biaxially oriented polypropylene (BOPP), polyethylene terephthalate (PET), and polyvinyl chloride (PVC).

9. The microrobot system of claim 1, where the support member is made from one or more of silicon, silicon dioxide, glass, sapphire, germanium, gallium arsenide, indium phosphate, alloys of silicon and germanium, titanium oxide, polyethylene (PE), biaxially oriented polypropylene (BOPP), polyethylene terephthalate (PET), polyvinyl chloride (PVC), and SU-8.

10. The microrobot system of claim 4, where the electrochromic polymer member is photopatternable.

11. A microrobot, comprising:
    a magnet configured to provide a motive force when magnetic force of one or more electrical coils act upon the magnet;
    a support member coupled to the magnet;
    a thermo-responsive polymer member coupled to each end of the support member at a proximal end, the thermo-responsive polymer member configured to articulate when heated,
    wherein the thermo-responsive polymer members configured to receive light from a microrobot structured light system and convert the received light into heat.

12. The microrobot of claim 11, wherein the one or more electrical coils are external to a substrate upon which the microrobot is disposed.

13. The microrobot of claim 11, wherein the one or more electrical coils are integrated into a substrate upon which the microrobot is disposed.

14. The microrobot of claim 11, where each microrobot further comprises an electrochromic polymer member coupled to a distal end of the thermo-responsive polymer member, the electrochromic polymer members configured to change colors when coupled across an object having an electrical potential.

15. The microrobot of claim 11, wherein the thermo-responsive polymer member includes PNIPAM.

16. The microrobot of claim 11, the thermo-responsive polymer members include gold nanorods.

17. The microrobot of claim 11, wherein the magnet is made of permanent magnetic, ferromagnetic, or paramagnetic material.

18. The microrobot of claim 11, wherein the substrate is made from one or more of silicon, silicon dioxide, glass, sapphire, germanium, gallium arsenide, indium phosphate, alloys of silicon and germanium, titanium oxide, polyethylene (PE), biaxially oriented polypropylene (BOPP), polyethylene terephthalate (PET), and polyvinyl chloride (PVC).

19. The microrobot of claim 11, where the support member is made from one or more of silicon, silicon dioxide, glass, sapphire, germanium, gallium arsenide, indium phosphate, alloys of silicon and germanium, titanium oxide, polyethylene (PE), biaxially oriented polypropylene (BOPP), polyethylene terephthalate (PET), polyvinyl chloride (PVC), and SU-8.

20. The microrobot of claim 14, where the electrochromic polymer member is photopatternable.

* * * * *